(12) United States Patent
Voelzke

(10) Patent No.: US 9,797,933 B2
(45) Date of Patent: Oct. 24, 2017

(54) METHOD FOR MONITORING THE POWER CONSUMPTION OF AN ELECTRICAL CONSUMER

(71) Applicant: dSPACE digital signal processing and control engineering GmbH, Paderborn (DE)

(72) Inventor: Florian Voelzke, Paderborn (DE)

(73) Assignee: dSPACE digital signal processing and control engineering GmbH, Paderborn (DE)

(*) Notice: Subject to any disclaimer, the term of this patent is extended or adjusted under 35 U.S.C. 154(b) by 320 days.

(21) Appl. No.: 14/693,083

(22) Filed: Apr. 22, 2015

(65) Prior Publication Data

US 2015/0323573 A1 Nov. 12, 2015

(30) Foreign Application Priority Data

May 9, 2014 (EP) ..................................... 14167629

(51) Int. Cl.
*G01R 21/133* (2006.01)
*G01R 21/00* (2006.01)
(Continued)

(52) U.S. Cl.
CPC .............. *G01R 21/00* (2013.01); *G01R 1/203* (2013.01); *H02H 9/025* (2013.01)

(58) Field of Classification Search
CPC ......... G01R 21/00; G01R 1/203; H02H 9/025
(Continued)

(56) References Cited

U.S. PATENT DOCUMENTS 8,299,767 B1 10/2012 Tuozzolo et al.
9,160,192 B2 10/2015 Martaeng
(Continued)

FOREIGN PATENT DOCUMENTS

CN 102822930 A 12/2012
CN 103001278 A 3/2013
(Continued)

OTHER PUBLICATIONS

European Search Report for European Application No. 14167629.6 dated Nov. 20, 2014, with English translation.
(Continued)

*Primary Examiner* — Melissa Koval
*Assistant Examiner* — Courtney McDonnough
(74) *Attorney, Agent, or Firm* — Muncy, Geissler, Olds & Lowe, P.C.

(57) ABSTRACT

A method for monitoring the power consumption of an electrical consumer that has a capacitive load and the controllable circuit element and the consumer are connected in series. The amplitude of the current flowing through the consumer, the voltage dropping across the consumer, and the change over time of the voltage dropping across the consumer are sensed. An allowed operating current amplitude is calculated from the voltage dropping across the consumer and from a predefined power. A charging current amplitude of the capacitive load is calculated from the change over time of the voltage dropping across the consumer. An allowed instantaneous current amplitude is calculated. The allowed instantaneous current amplitude is compared with the amplitude of the current flowing through the consumer and the electrical resistance of the circuit element is increased if the amplitude of the current flowing through the consumer is greater than the allowed instantaneous current amplitude.

13 Claims, 3 Drawing Sheets

(51) Int. Cl.
*G01R 1/20* (2006.01)
*H02H 9/02* (2006.01)

(58) Field of Classification Search
USPC .......................................................... 324/142
See application file for complete search history.

(56) References Cited

U.S. PATENT DOCUMENTS

| | | | |
|---|---|---|---|
| 2006/0129339 A1* | 6/2006 | Bruno | G01R 22/10 702/60 |
| 2011/0018549 A1* | 1/2011 | Hashimoto | G01R 31/2839 324/537 |
| 2012/0087053 A1 | 4/2012 | Mizui | |
| 2013/0021702 A1 | 1/2013 | Waltman et al. | |
| 2013/0049686 A1* | 2/2013 | Erhart | H02H 9/025 320/109 |
| 2013/0154672 A1 | 6/2013 | Fabregas et al. | |

FOREIGN PATENT DOCUMENTS

| | | |
|---|---|---|
| CN | 103158576 A | 6/2013 |
| EP | 2 562 896 A2 | 2/2013 |
| EP | 2 570 293 A1 | 3/2013 |
| WO | WO 9811642 A2 | 3/1998 |
| WO | WO 00/13279 A1 | 3/2000 |

OTHER PUBLICATIONS

Chinese Office Action for Chinese Application No. 201510205416.1 dated Jun. 22, 2017 with English translation.

* cited by examiner

METHOD FOR MONITORING THE POWER CONSUMPTION OF AN ELECTRICAL CONSUMER

This nonprovisional application claims priority under 35 U.S.C. §119(a) to European Patent Application No. EP14167629.6, which was filed on May 9, 2014, and which is herein incorporated by reference.

BACKGROUND OF THE INVENTION

Field of the Invention

The present invention relates to a method for monitoring the power consumption of an electrical consumer and an electronic fuse.

Description of the Background Art

Controllable electronic fuses for monitoring power consumption are known from the prior art. The document WO 2000/13279 describes a circuit configuration for an electronic fuse whose flow of current is regulated by an actuating element as a function of an applied voltage. The document U.S. Pat. No. 8,299,767 B2 describes driving of a transistor based on monitoring of the power consumption of the transistor. A circuit for limiting inrush currents using a sense capacitor is known from the document US 2013/0021 702 A1. The document US 2012/0087 053 A1 describes a power supply with a circuit for protection from overcurrent.

SUMMARY OF THE INVENTION

It is therefore an object of the present invention to provide a device that advances the state of the art.

According to an embodiment of the invention, a method for monitoring the power consumption of an electrical consumer is developed wherein the consumer has a capacitive load, wherein a controllable circuit element and the electrical consumer are connected in series, the amplitude of the current flowing through the consumer is sensed, the voltage dropping across the consumer is sensed, the change over time of the voltage dropping across the consumer is sensed, an allowed operating current amplitude is calculated from the voltage dropping across the consumer and from a predefined maximum value for the power consumption of the electrical consumer, a charging current amplitude of the capacitive load is calculated from the change over time of the voltage dropping across the consumer, an allowed instantaneous current amplitude is calculated in consideration of the allowed operating current amplitude and the charging current amplitude, the allowed instantaneous current amplitude is compared with the amplitude of the current flowing through the consumer, and the electrical resistance of the circuit element is increased if the amplitude of the current flowing through the consumer is greater than the allowed instantaneous current amplitude.

It should be noted that the capacitive load of the consumer can be a net capacitance of the consumer, which can be represented as the sum of the capacitances of multiple electrical components built into the consumer. The allowed instantaneous current amplitude can be a maximum allowed value of the instantaneous current amplitude of the input current into the consumer that is physically measurable at a given point in time. The charging current amplitude can be the current amplitude of the component of the input current into the consumer that is used to charge or discharge the capacitive load of the consumer at a given point in time. The operating current amplitude can be the current amplitude that results from the amplitude of the current flowing through the consumer minus the charging current amplitude.

An advantage of the invention is that it permits safe operation of an electrical consumer in different power networks with different operating voltages. Particularly in automotive engineering, different standards for on-board power supply networks are widespread that provide different operating voltages in normal operation, for instance 12V, 24V, 42V, or 48V. In the context of development and testing of software for motor vehicle control units, it is known from the prior art to connect portable, programmable control devices to the on-board power supply network and to have them temporarily take over the function of a motor vehicle control unit. By dynamically adapting the allowed instantaneous current amplitude to the input voltage currently being applied, the invention makes it possible to build an electronic fuse that protects the portable, programmable control device from overload at different input voltages without impairing the operation of the portable, programmable control device through false tripping. One and the same portable, programmable control device can be used in different on-board networks without replacing the power supply.

Another advantage of the invention is that in addition to different operating voltages, brief voltage variations can also be detected and taken into account. Variations in the output voltage can also occur, in the on-board power supply network in particular, due to the connection and disconnection of consumers, especially when the vehicle is operated with the battery disconnected or when the battery is disconnected while the engine is running. In order to be able to function reliably in an environment of this nature, an electronic fuse must exhibit a suitably reduced value for the allowed operating current amplitude during an overvoltage pulse in order to prevent excessively high power consumption by the consumer.

Yet another advantage of the invention is that the charging currents in capacitive loads of the consumer resulting from the aforesaid variations in the output voltage are detected. The charging current of a capacitive load, for example a capacitor, is obtained from the formula $I=C*dU/dT$ as the product of the capacitance of the capacitive load and the change of the input voltage over time. Accordingly, brief voltage variations can result in charging currents of capacitive loads that may briefly be very high under certain circumstances, and it is not desirable in general for these charging currents to immediately bring about tripping of the electronic fuse. Because of the separate sensing of the charging current amplitudes of capacitive loads of the consumer, these charging currents are recognized as such and are taken into account when determining the allowed instantaneous current amplitude.

In an embodiment of the invention, the calculation of the allowed instantaneous current amplitude additionally contains a predefined DC component in order to counteract false tripping of the electronic fuse as a result of inaccuracies in the calculation of the allowed operating current amplitude or charging current amplitude.

In an embodiment of the invention, the charging current amplitude is ascertained via an analog circuit. A digital circuit, in which the analog charging current amplitude would first have to be converted into a digital value by an analog/digital converter, would be too slow to recognize a charging current and avoid false tripping of the electronic fuse, in view of the time that would be required for converting the analog current amplitude into a digital value and subsequently analyzing it digitally. In an embodiment, the charging current amplitude is ascertained via a sense capacitor. A sense capacitor can be a capacitor that is connected in parallel with the consumer and has a capacitance that is significantly smaller than the capacitance of the capacitive load of the consumer, so that measurement of the charging current amplitude by the sense capacitor does not distort the result. The current flowing through the sense capacitor is measured via a measuring resistor and the charging current of the capacitive load of the consumer is inferred from this. In another embodiment, the current flowing through the capacitor is measured via a peak detector to prevent underestimation of the charging current amplitude due to inductances and/or capacitive loads and/or ohmic loads in the consumer.

In another embodiment, the allowed operating current amplitude can be determined via a digital circuit. In contrast to the case of the charging current amplitude, there are no special requirements here for the speed of the determination; a digital circuit is advantageous at this point because the allowed operating current amplitude results from division of the allowed power consumption by the current operating voltage, and division is difficult to implement with an analog circuit.

In one embodiment of the invention, the circuit element is placed in a non-conducting state as soon as the amplitude of the current flowing through the consumer is greater than the allowed instantaneous current amplitude.

In an embodiment, the circuit element can be a transistor, for example, a MOSFET, whose electrical resistance is controlled by driving the gate voltage. In an embodiment the gate voltage is set to zero as soon as the amplitude of the current flowing through the consumer is greater than the allowed instantaneous current amplitude, so that the transistor is placed in a non-conducting state. In another embodiment, the gate voltage is at least temporarily reduced in this case but is not set to zero, so that the transistor is placed in a state of increased electrical resistance and a part of the applied voltage drops across the transistor.

In another embodiment, the electrical consumer and the circuit element are designed and configured to be connected to an on-board power supply network with an operating voltage in the range from 12V to 48V.

Furthermore, according to an embodiment of the invention an electronic fuse is developed in the form of a device for monitoring the power consumption of an electrical consumer, wherein the consumer has a capacitive load, wherein the device has a controllable circuit element and a control device for the controllable circuit element, and wherein the device and the electrical consumer are electrically connected such that the circuit element and the electrical consumer are connected in series. In this design, the control device is designed to sense the amplitude of the current flowing through the electrical consumer, the voltage dropping across the electrical consumer, and the change over time of the voltage dropping across the electrical consumer, to calculate an allowed operating current amplitude from the voltage dropping across the electrical consumer and a predefined maximum value for the power consumption of the electrical consumer, to calculate a charging current amplitude of the capacitive load from the change over time of the voltage dropping across the electrical consumer, to calculate an allowed instantaneous current amplitude from the allowed operating current amplitude and the charging current amplitude, to compare the allowed instantaneous current amplitude with the amplitude of the current flowing through the electrical consumer via a comparator, and to increase the electrical resistance of the circuit element if the amplitude of the current flowing through the electrical consumer is greater than the allowed instantaneous current amplitude.

The device can be designed as a component of a power supply, wherein the power supply is designed as a DC-DC converter, in particular a boost converter. The power supply can be designed and configured to connect an electrical consumer to an on-board network with an operating voltage in the range from 12V to 48V.

The device can be configured to sense the change over time of the voltage dropping across the electrical consumer via an analog circuit by sensing the charging current of a sense capacitor, and for the device to be configured to calculate the allowed operating current amplitude via a digital computing operation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
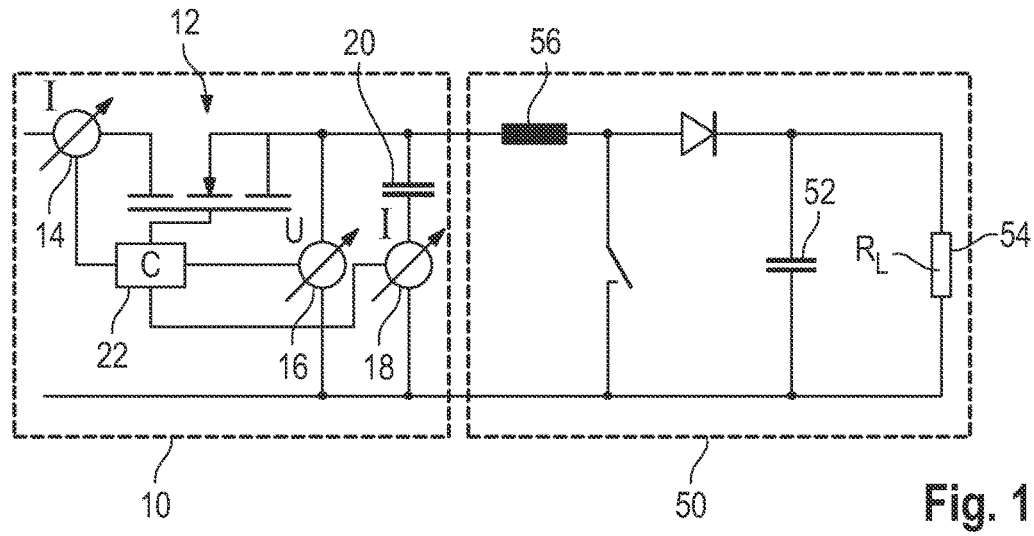
FIG. 1 shows a simplified schematic diagram of the device according to the invention in an embodiment and an electrical consumer.

The diagram in FIG. 1 shows an electronic fuse in the form of a device 10 according to the invention in an exemplary embodiment, and an electrical consumer 50. The device 10 has a circuit element 12 in the form of a transistor, which is connected in series with the electrical consumer 50. The device 10 also contains a control device for controlling the gate voltage of the circuit element 12. According to the invention, the control device has a first measuring device 14 for measuring the amplitude of the current flowing through the consumer 50. According to the invention, the control device additionally has a second measuring device 16 for measuring the voltage dropping across the consumer 50. According to the invention, the control device additionally has a third measuring device 18 for measuring the amplitude of the charging current of a capacitive load of the consumer 50, wherein the third measuring device 18 preferably is designed to measure the amplitude of the current flowing through a sense capacitor 20 connected in parallel to the circuit element 12 and the consumer 50. According to the invention, the control device additionally has an analysis unit 22 that reads the measured quantities produced by the first measuring device 14, the second measuring device 16, and the third measuring device 18, and controls the gate voltage of the circuit element 12 as a function of these three measured quantities. In one embodiment of the invention, the analysis unit 22 includes at least one comparator and a microcontroller.

The electrical consumer 50 preferably includes a switching power supply in the form of a DC-DC converter, in particular a boost converter, and an electrical load 54, for example a dSPACE AutoBox. The switching power supply and the electronic fuse 10 are preferably designed and configured to be connected to a DC power supply network, in particular an on-board power supply network, with a typical operating voltage in the range from 12V to 48V. The DC-DC converter includes at least one capacitor 52. This capacitor forms the capacitive load of the consumer 50 together with additional capacitors or other capacitive components in the switching power supply and the load 54. The DC-DC converter further includes at least one inductance 56, which influences the charging process of the capacitive load. It should be noted that the boost converter is depicted in an idealized, and hence greatly simplified, form.

Figure 2:
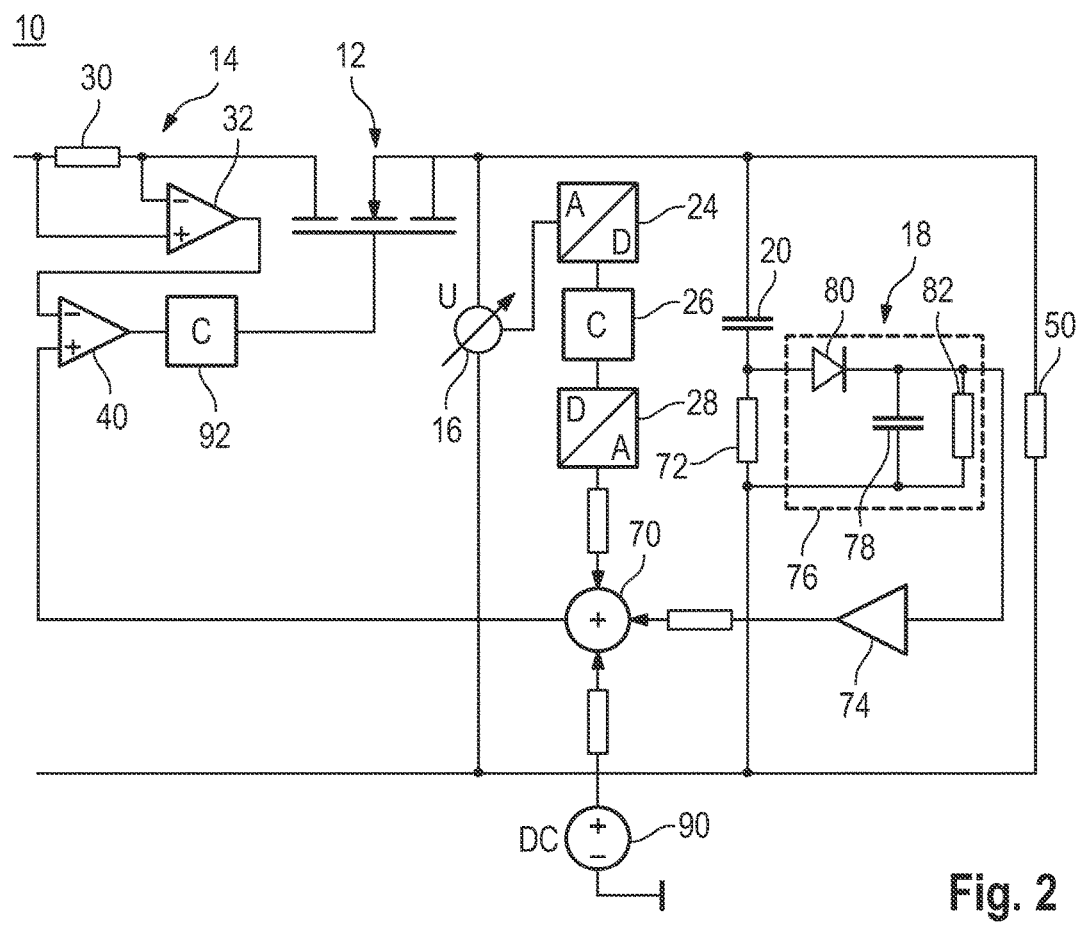
FIG. 2 shows a detailed schematic diagram of the device according to the invention in an embodiment.

The illustration in FIG. 2 shows a detailed schematic diagram of the device 10 according to the invention in an embodiment. The first measuring device 14 is implemented in the form of a measuring resistor 30. A differential amplifier 32 measures the voltage drop across the measuring resistor 30, multiplies this by the reciprocal of the electrical resistance of the measuring resistor 30, and delivers the result to a comparator 40 in the form of an analog signal.

The second measuring device 16 for measuring the voltage dropping across the consumer 50 is designed in the form of a voltage meter that delivers the measured value to an analog/digital converter 24 in the form of an analog voltage. A microcontroller 26 calculates a value for the allowed operating current amplitude from the digital value by the means that it divides a predefined maximum value for the power consumption of the consumer 50 by the voltage measured by the second measuring device 16. It delivers the calculated value for the allowed operating current amplitude to a digital/analog converter 28, which in turn delivers the value to an adder unit 70 in the form of an analog signal. The analog/digital converter 24, the microcontroller 26, the digital/analog converter 28, and the adder unit 70 can be components of the analysis unit 22.

The third measuring device 18 for measuring the amplitude of the charging current of a capacitive load of the consumer 50 is implemented in the form of a sense capacitor 20 and a circuit for monitoring the charging current of the sense capacitor 20. The sense capacitor 20 is connected in parallel with the consumer 50. Measurement of the amplitude of the current flowing through the sense capacitor 20 is accomplished via a measuring resistor 72. To this end, an amplifier 74 measures the voltage dropping across the measuring resistor 72, multiplies it by a factor C2/(C1*R), wherein C1 is the capacitance of the sense capacitor 20, C2 is the capacitance of the capacitive load of the consumer 50, and R is the electrical resistance of the measuring resistor 72, and delivers the result to the adder unit 70 in the form of an analog signal.

In an embodiment, the amplifier 74 measures the voltage dropping across the measuring resistor 72 via a peak detector 76. This peak detector is composed of a capacitor 78 connected in parallel with the measuring resistor 72, a diode 80, and a resistor 82. In this design, the components of the peak detector 76 are arranged such that the capacitor 78 is first charged to a voltage that corresponds to the voltage dropping across the measuring resistor 72, and then slowly discharges through the resistor 82. The amplifier in this exemplary embodiment measures the voltage of the capacitor 78 of the peak detector 76.

The use of a peak detector in the manner just described prevents underestimation of the charging current amplitude of the capacitive load of the consumer 50 for the case in which the behavior of the current is influenced by an additional inductive component and/or a series resistor. This principle is illustrated by FIGS. 3 and 4.

Figure 3:
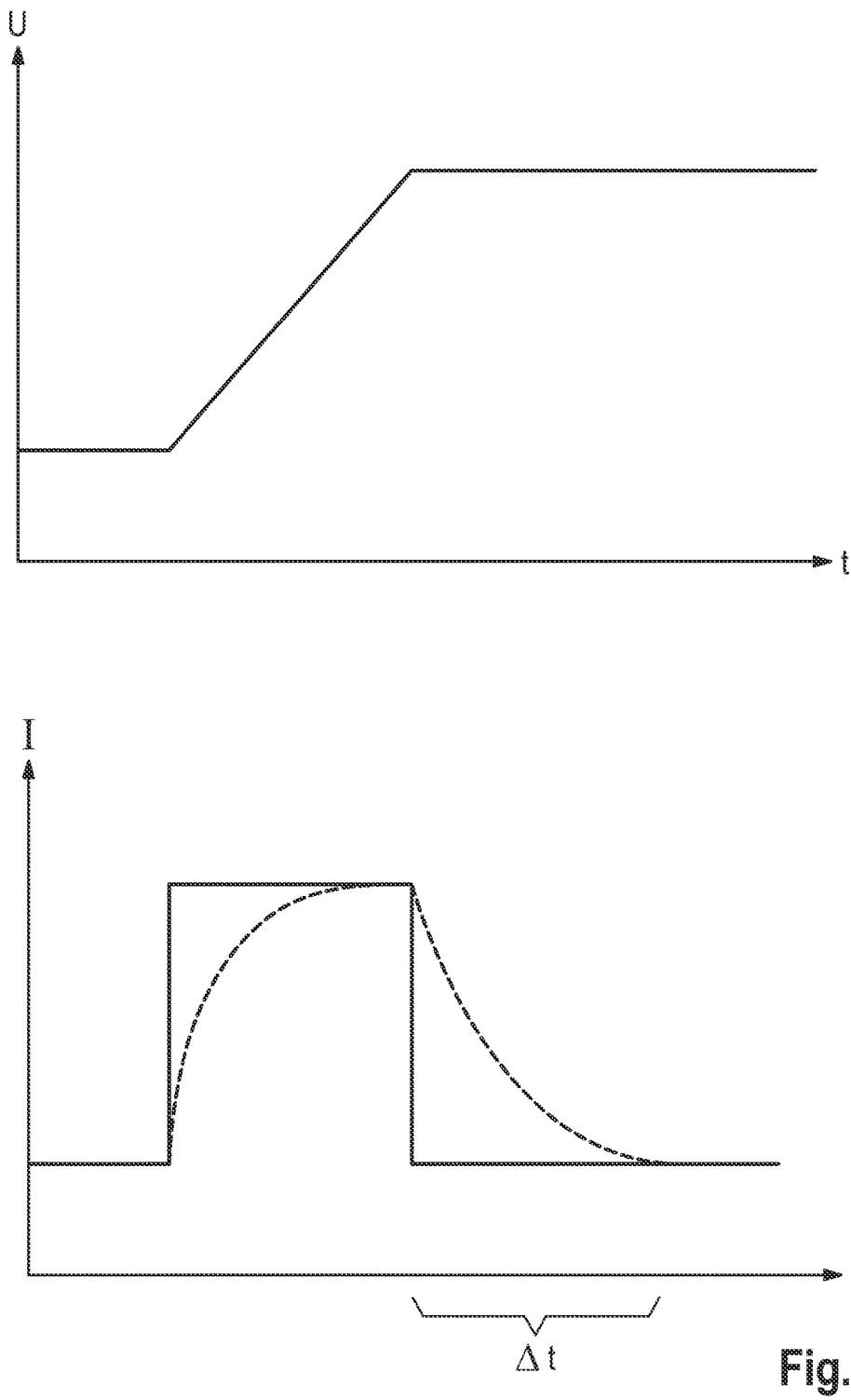
FIG. 3 shows a qualitative representation of the distortion of an ideal charging process of a capacitive load by an ohmic resistance placed ahead of the capacitive load.

The top plot in FIG. 3 shows an assumed variation in the operating voltage in the form of a linear voltage rise. The solid curve in the bottom plot shows the resulting charging current of the sense capacitor 20. This capacitor is directly subjected to the power supply voltage of the power supply network, and consequently behaves approximately like an ideal capacitor. The dashed curve shows, by way of example, a charging current of the capacitive load of the consumer 50 for the case of an ohmic resistor connected ahead of the capacitive load. This capacitive load is subjected to the influence of a number of resistors, which delay the charging of the capacitive load of the consumer 50. As is evident from the curves, this results in an underestimation of the charging current within a time interval Δt. This underestimation can in turn cause false tripping of the electronic fuse.

Figure 4:
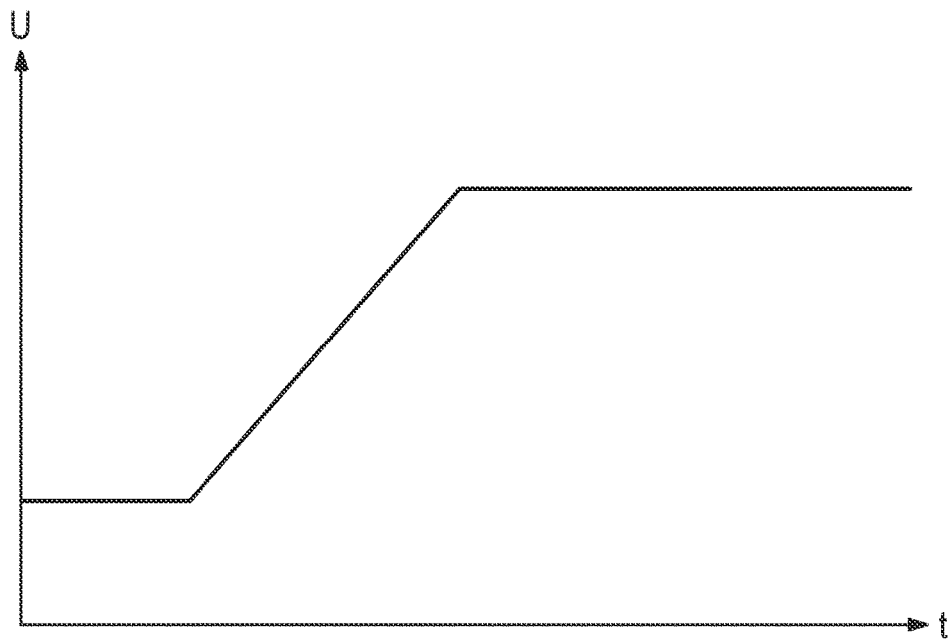
FIG. 4 shows, in another qualitative representation, this distortion being taken into account via a peak detector.
Figure 4:
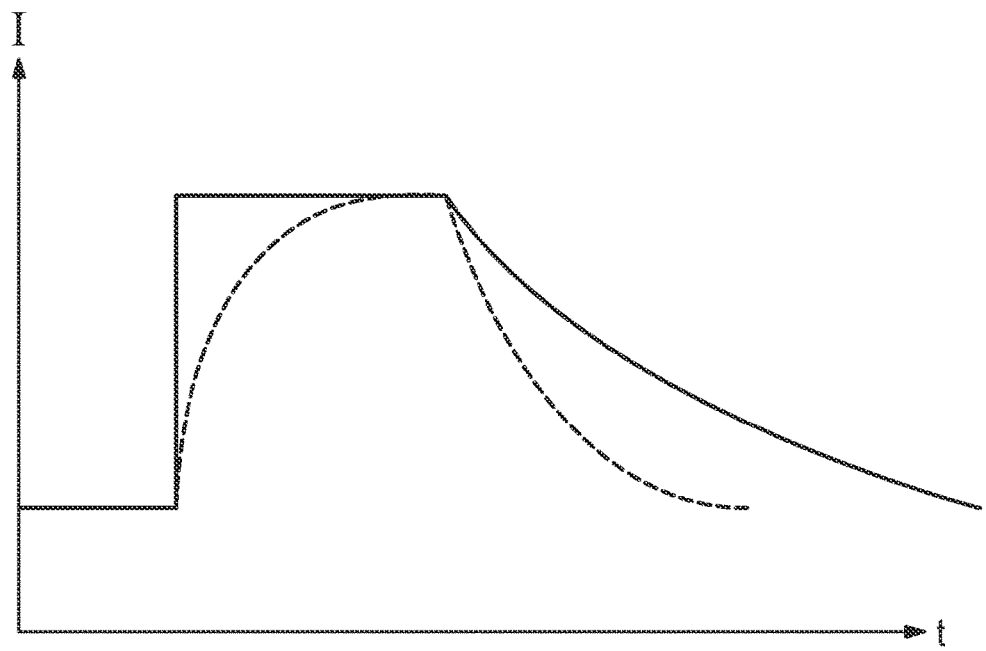

The top plot in FIG. 4 shows the same assumed variation in the operating voltage as in FIG. 3. The solid curve in the bottom plot shows the charging current measured at the sense capacitor 20 using a peak detector. As is evident from the plot, an overestimation of the charging current of the capacitive load of the consumer 50 now takes place at every point in time. False tripping of the electronic fuse due to underestimation of the charging current is prevented by this means. Through skilled selection of the capacitor 78 and the resistor 82 of the peak detector, the peak detector can be designed such that it now discharges only slightly slower than the capacitive load of the consumer 50, so that the resulting overestimation of the charging current is small.

The embodiment of the device 10 according to the invention shown in FIG. 2 additionally has a constant signal generator 90, which delivers a constant analog signal to the adder unit 70. In this way, it impresses a DC component onto the signals generated by the second measuring device 16 and the third measuring device 18, and thereby counteracts false tripping of the electronic fuse as a result of measurement errors.

The adder unit 70 calculates the allowed instantaneous current amplitude by adding the three analog signals delivered to it, and delivers the value thereof in the form of an analog signal to the comparator 40, which compares this value with the amplitude of the current flowing through the consumer 50. The comparator 40 delivers the result of the comparison to a microprocessor 92 in the form of a binary signal. The microprocessor 92 controls the gate voltage of the circuit element and increases its electrical resistance if the amplitude of the current flowing through the consumer 50 is greater than the allowed instantaneous current amplitude. Because the charging currents of the capacitive load of the consumer 50 sensed by the third measuring unit 18 are always added to the allowed instantaneous current amplitude, they never result in tripping of the fuse.

It is a matter of course that the embodiment shown in FIG. 2 is an example, and that variations are possible that are apparent to the person skilled in the art and that fall under the preamble to claim 1 or claim 10. In particular, the design of the signal analysis and the control of the circuit element 12 by the analysis unit 22 can also be implemented differently, for example such that charging currents of the capacitive load of the consumer can also, under certain circumstances, result in triggering of the electronic fuse, which is to say an increase in the electrical resistance of the circuit element 12.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for monitoring a power consumption of an electrical consumer via a controllable circuit element, the electrical consumer having a capacitive load, the method comprising:
    connecting the controllable circuit element and the electrical consumer in series;
    sensing an amplitude of a current flowing through the electrical consumer;
    sensing a voltage drop across the electrical consumer;
    sensing a change over time of the voltage drop across the electrical consumer;
    calculating an allowed operating current amplitude from the voltage drop across the electrical consumer and from a predefined maximum value for the power consumption of the electrical consumer;
    calculating a charging current amplitude of the capacitive load from the change over time of the voltage dropping across the electrical consumer;
    calculating an allowed instantaneous current amplitude with respect to the allowed operating current amplitude and the charging current amplitude;
    comparing the allowed instantaneous current amplitude with the amplitude of the current flowing through the consumer; and
    increasing the electrical resistance of the circuit element if the amplitude of the current flowing through the electrical consumer is greater than the allowed instantaneous current amplitude.

2. The method according to claim 1, wherein the allowed instantaneous current amplitude is calculated from the allowed operating current amplitude, the charging current amplitude, and a predefined DC component.

3. The method according to claim 1, wherein the allowed operating current amplitude is calculated via a digital circuit.

4. The method according to claim 1, wherein the change over time of the voltage dropping across the consumer is sensed via an analog circuit.

5. The method according to claim 4, wherein a sense capacitor is connected in parallel with the electrical consumer, wherein the charging current of the sense capacitor is sensed, and wherein the change over time of the voltage dropping across the consumer is calculated from the charging current of the sense capacitor.

6. The method according to claim 5, wherein a measuring resistor is connected in series with the sense capacitor and a peak detector is connected in parallel with the measuring resistor, wherein the voltage of the peak detector is determined, and wherein the charging current of the sense capacitor is calculated from the voltage of the peak detector.

7. The method according to claim 1, wherein the circuit element is placed in a non-conducting state if the amplitude of the current flowing through the consumer is greater than the allowed instantaneous current amplitude.

8. The method according to claim 1, wherein the circuit element is a transistor and the electrical resistance of the transistor is controlled by driving a gate voltage or a base voltage of the transistor.

9. The method according to claim 1, wherein the electrical consumer and the circuit element are connected to an on-board network with an operating voltage in a range from 12V to 48V.

10. A circuit device for monitoring a power consumption of an electrical consumer, the electrical consumer having a capacitive load, the circuit device comprising:
    a controllable circuit element;
    a control device for the controllable circuit element, the device and the electrical consumer being electrically connected such that the circuit element and the electrical consumer are connected in series,
    wherein the control device senses an amplitude of a current flowing through the electrical consumer, a voltage dropping across the electrical consumer, and a change over time of the voltage dropping across the electrical consumer to:
        calculate an allowed operating current amplitude from the voltage dropping across the electrical consumer and a predefined maximum value for the power consumption of the electrical consumer;
        calculate a charging current amplitude of a capacitive load from the change over time of the voltage dropping across the electrical consumer;
        calculate an allowed instantaneous current amplitude from the allowed operating current amplitude and the charging current amplitude;
        compare the allowed instantaneous current amplitude with the amplitude of the current flowing through the electrical consumer via a comparator; and
        increase the electrical resistance of the circuit element if the amplitude of the current flowing through the electrical consumer is greater than the allowed instantaneous current amplitude.

11. The circuit device according to claim 10, wherein the circuit device is a component of a power supply, and the power supply is a DC-DC converter or a boost converter.

12. The circuit device according to claim 11, wherein the power supply connects an electrical consumer to an on-board network with an operating voltage in a range from 12V to 48V.

13. The circuit device according to claim 10, wherein the circuit device senses the change over time of the voltage dropping across the electrical consumer via an analog circuit by sensing the charging current of a sense capacitor, and wherein the circuit device calculates the allowed operating current amplitude via a digital computing operation.

* * * * *